US012787732B2

(12) United States Patent
Chuang

(10) Patent No.: US 12,787,732 B2
(45) Date of Patent: Nov. 3, 2026

(54) METHOD FOR FORMING SEMICONDUCTOR STRUCTURE

(71) Applicant: Winbond Electronics Corp., Taichung City (TW)

(72) Inventor: Che-Fu Chuang, Changhua City (TW)

(73) Assignee: Winbond Electronics Corp., Taichung City (TW)

( * ) Notice: Subject to any disclaimer, the term of this patent is extended or adjusted under 35 U.S.C. 154(b) by 324 days.

(21) Appl. No.: 18/670,750

(22) Filed: May 22, 2024

(65) Prior Publication Data

US 2025/0300017 A1 Sep. 25, 2025

(30) Foreign Application Priority Data

Mar. 21, 2024 (TW) ................................ 113110534

(51) Int. Cl.
*H10W 20/00* (2026.01)

(52) U.S. Cl.
CPC ................................ *H10W 20/069* (2026.01)

(58) Field of Classification Search
None
See application file for complete search history.

(56) References Cited

U.S. PATENT DOCUMENTS

| | | | | |
|---|---|---|---|---|
| 10,084,097 | B2 | 9/2018 | Zou | |
| 10,438,957 | B2 | 10/2019 | Tsai et al. | |
| 11,380,582 | B2 | 7/2022 | Chuang | |
| 2021/0391432 | A1* | 12/2021 | Yoo | H10D 30/024 |
| 2022/0208987 | A1* | 6/2022 | Deng | H10D 64/01 |
| 2024/0021684 | A1* | 1/2024 | Lin | H10D 30/014 |
| 2024/0170546 | A1* | 5/2024 | Choi | H10D 30/014 |
| 2024/0304500 | A1* | 9/2024 | Liu | H10D 84/0184 |

* cited by examiner

*Primary Examiner* — Alexander G Ghyka
(74) *Attorney, Agent, or Firm* — JCIPRNET

(57) ABSTRACT

A method for forming a semiconductor structure, comprising: forming a stacked structure on a substrate, the stacked structure including a cap structure including first and second cap layers of different materials; sequentially forming first and second spacer material layers on the substrate and the stacked structure; removing a first portion of the second spacer material layer and a first portion of the first spacer material layer to expose the second cap layer; removing a second portion of the second spacer material layer, so that a portion of the second cap layer protrudes from the second spacer material layer; forming a hard mask pattern self-aligned with the portion of the second cap layer; and using the hard mask pattern as a mask, removing a third portion of the second spacer material layer to form a spacer structure on the sidewall of the stacked structure.

10 Claims, 13 Drawing Sheets

METHOD FOR FORMING SEMICONDUCTOR STRUCTURE

CROSS-REFERENCE TO RELATED APPLICATION

This application claims the priority benefit of Taiwan application serial no. 113110534, filed on Mar. 21, 2024. The entirety of the above-mentioned patent application is hereby incorporated by reference herein and made a part of this specification.

BACKGROUND

Technical Field

The present disclosure relates to a method for forming a semiconductor structure.

Description of Related Art

As the size of integrated circuits shrinks, the distance between the self-aligned contact structure and the gate structure becomes smaller, so the probability of leakage current due to short circuit increases. Traditionally, when making self-aligned contact structures, the thickness of the spacer structure of the gate structure may be lost when forming the self-aligned contact structure. Such an incomplete and thinned spacer structure may not be able to effectively isolate the self-aligned contact structure and the gate structure, resulting in leakage current from the gate structure to the self-aligned contact structure.

Although existing self-aligned contact structures are generally adequate for their original intended use, they do not yet fully meet the requirements in every aspect. Therefore, developing a process that can further improve the yield of self-aligned contact structures is still one of the research topics currently being studied by the industry.

SUMMARY

The present disclosure provides a method for forming a semiconductor structure, which forms a spacer structure with an approximately vertical profile, reduces the loss of the thickness of the spacer structure caused by the etching removal step, avoids the exposure of the shoulders of the gate structure, and thereby improves the problems such as word line leakage, bit line leakage or short circuit, and improves the reliability and performance of components.

The disclosure provides a method for forming a semiconductor structure, which includes: providing a substrate; forming a plurality of stacked structures on the substrate, each of the plurality of stacked structures including a cap structure, the cap structure including a first cap layer and a second cap layer located on the first cap layer, and materials of the first cap layer and the second cap layer are different; forming a first spacer material layer on the substrate and the plurality of stacked structures; forming a second spacer material layer on the first spacer material layer; performing a planarization process to remove a first portion of the second spacer material layer and a first portion of the first spacer material layer to expose the second cap layer in each of the plurality of stacked structures; removing a second portion of the second spacer material layer such that a first portion of the exposed second cap layer in each of the plurality of stacked structures protruding from the second spacer material layer; forming a plurality of hard mask patterns that are self-aligned with the first portion of the exposed second cap layer in each of the plurality of stacked structures; using the plurality of hard mask patterns as a mask, removing a third portion of the second spacer material layer to form a first spacer structure on a sidewall of each of the plurality of stacked structures; forming a sacrificial layer on the plurality of hard mask patterns and between the plurality of stacked structures; removing the sacrificial layer and a second portion of the first spacer material layer to form a plurality of contact openings between the plurality of stacked structures, and the plurality of contact openings exposing the substrate; and filling the plurality of contact openings with conductive material to form a plurality of contact plugs.

DESCRIPTION OF THE EMBODIMENTS

Figure 1A:
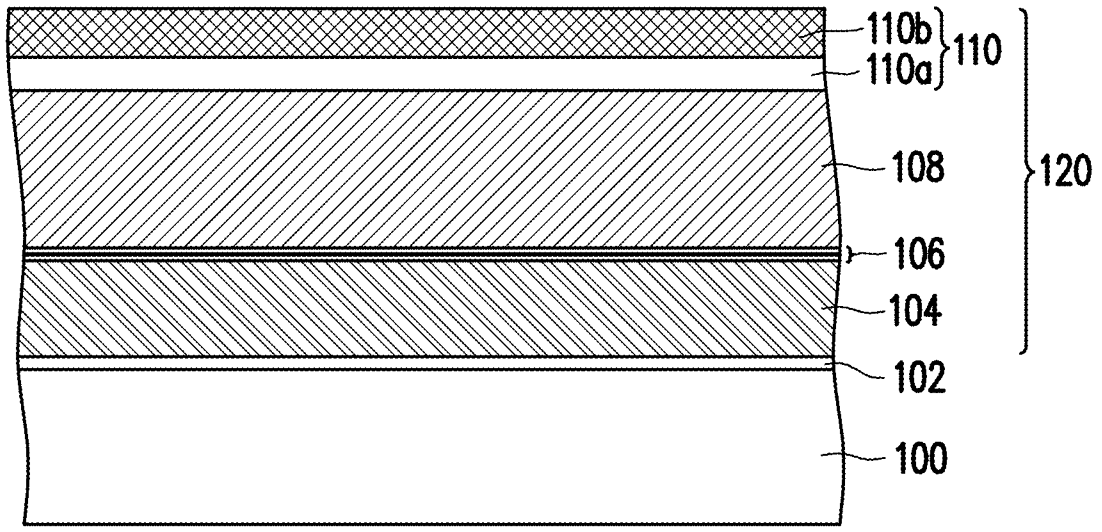
FIG. 1A to FIG. 1Q are schematic cross-sectional structural views of a semiconductor structure at various stages in the formation method according to an embodiment of the present disclosure.

The present disclosure will be described more fully with reference to the drawings of this embodiment. However, the present disclosure may also be embodied in various forms and should not be limited to the embodiments described herein. The thickness of layers and regions in the diagram is exaggerated for clarity. The same or similar reference numerals represent the same or similar components, which will not be described one by one in the following paragraphs.

Figure 1B:
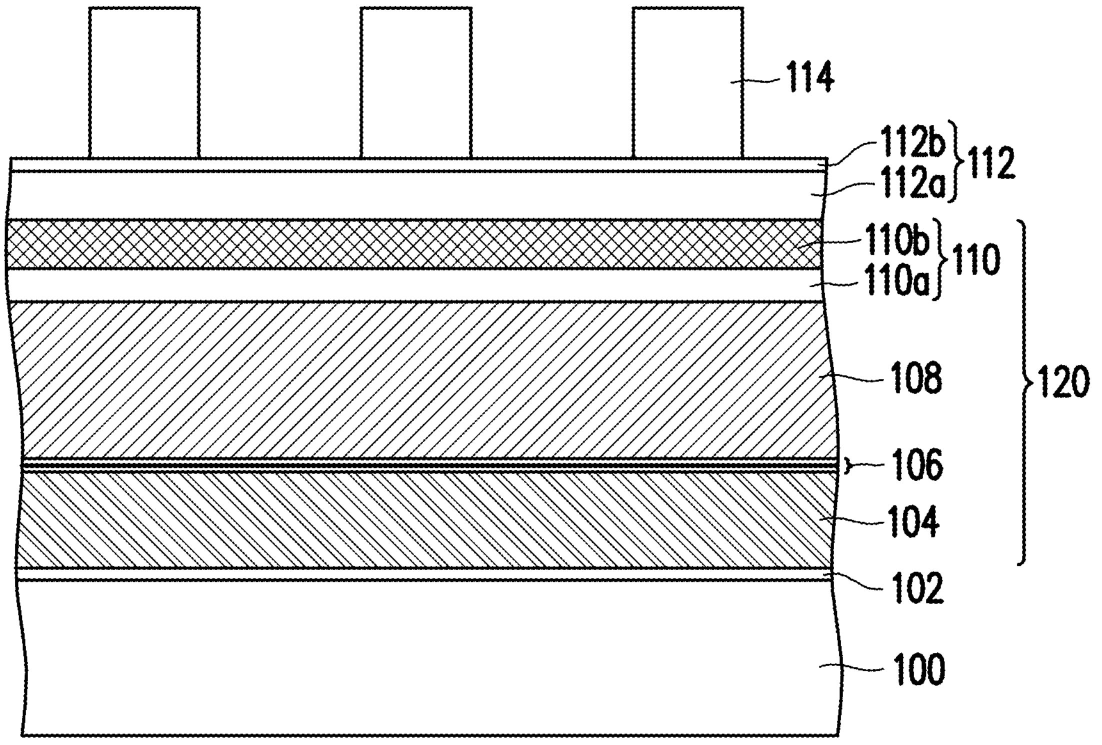
Figure 1C:
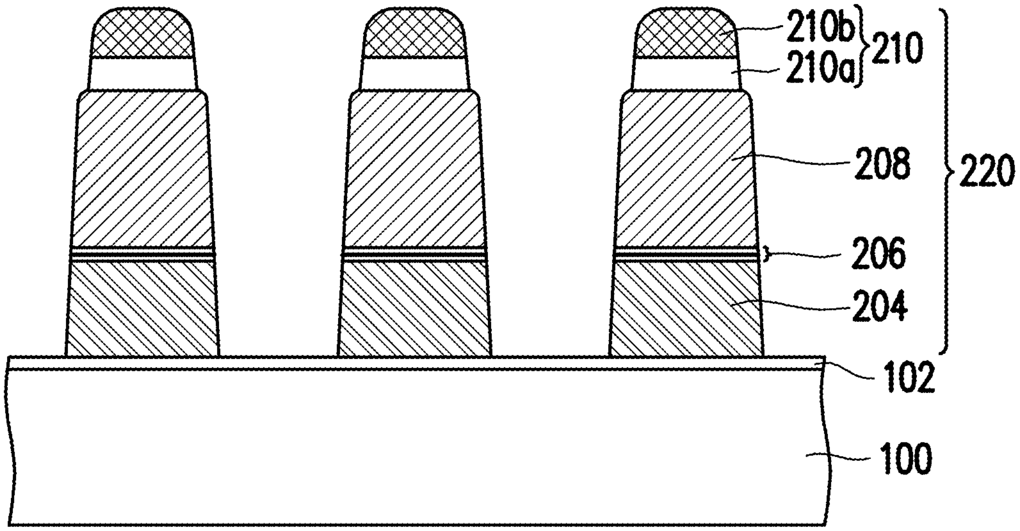
Figure 1D:
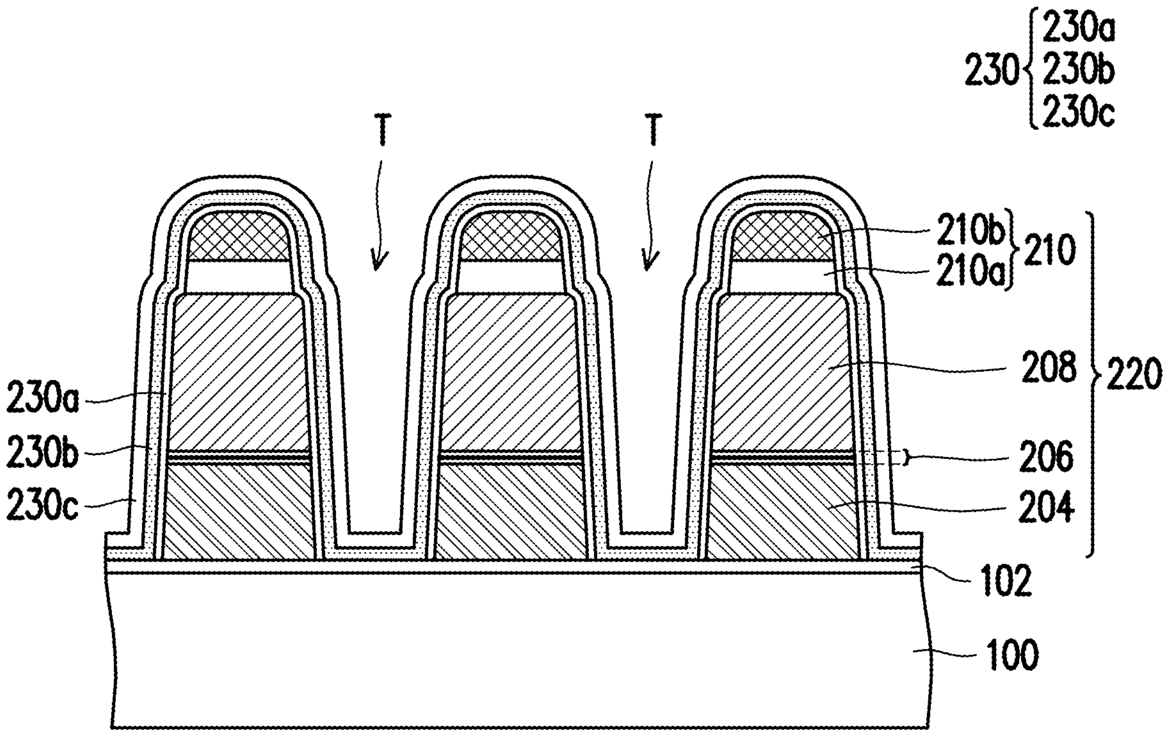
Figure 1E:
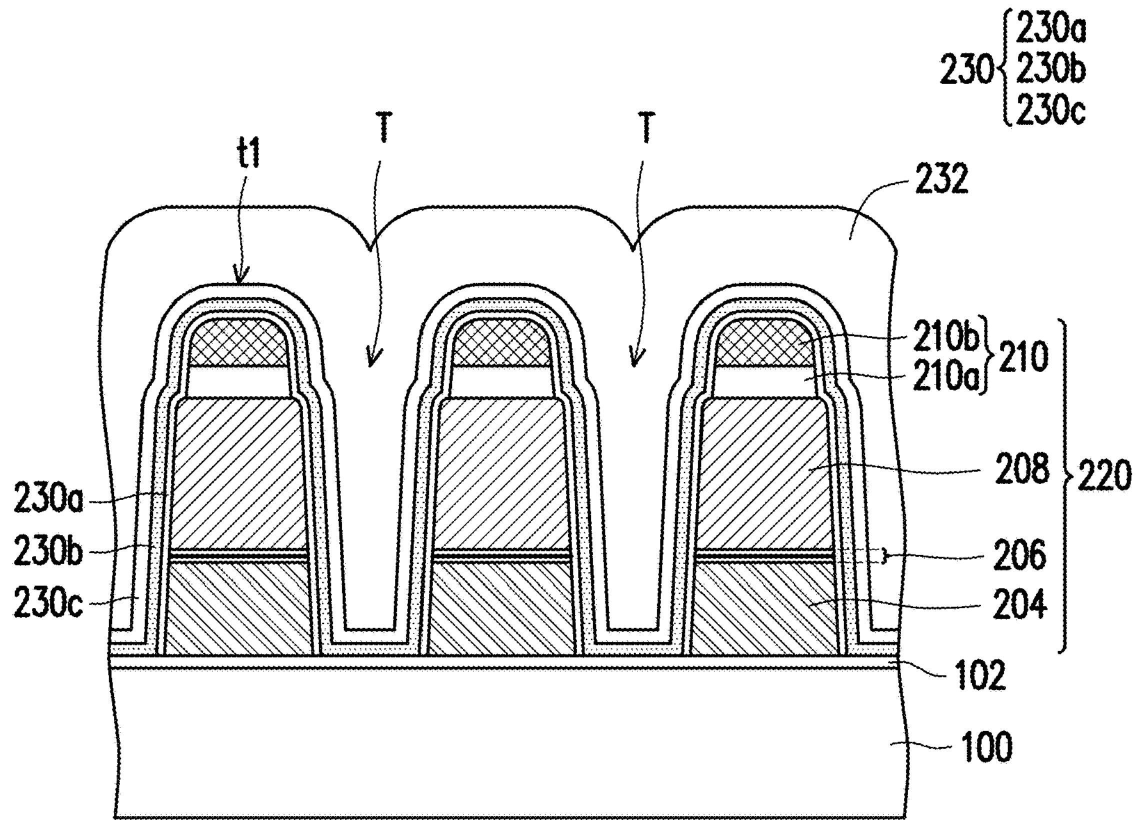
Figure 1F:
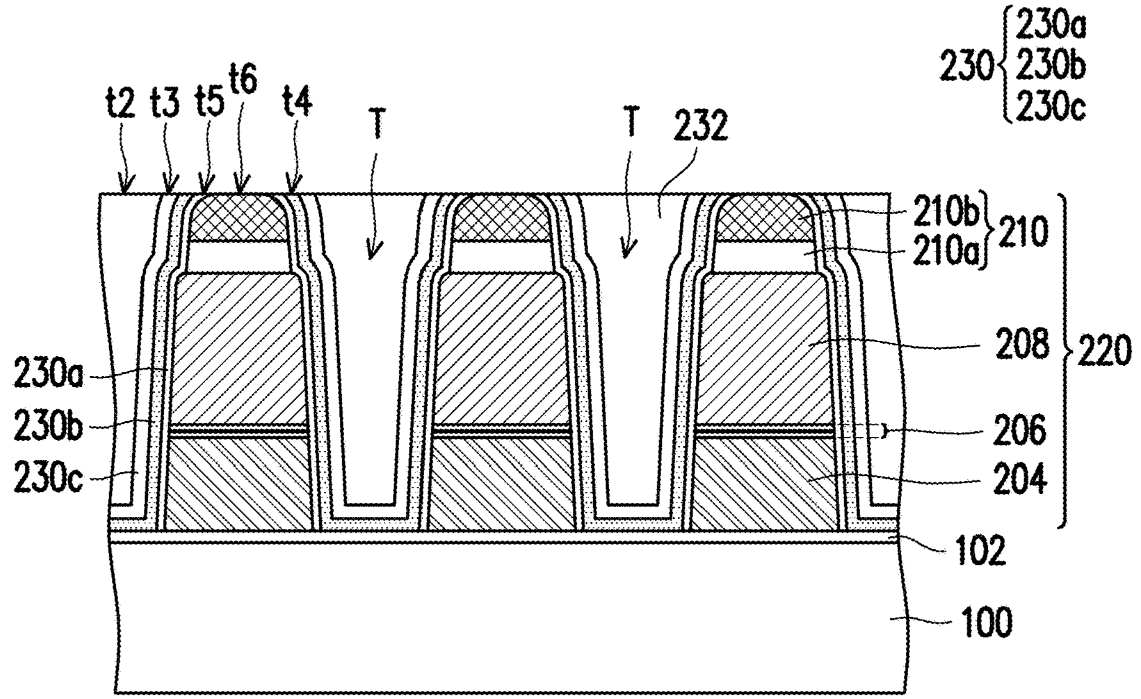
Figure 1G:
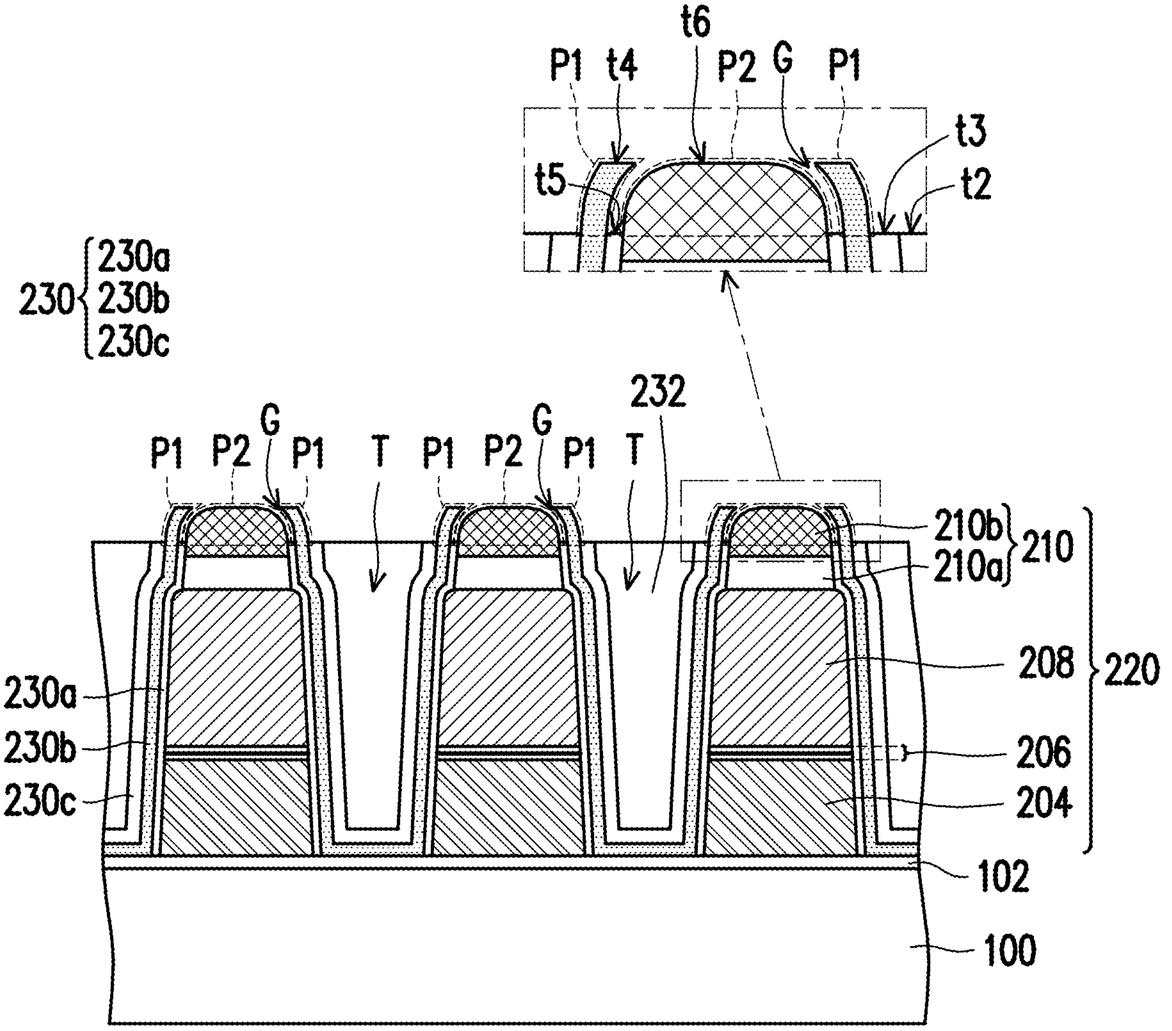
Figure 1H:
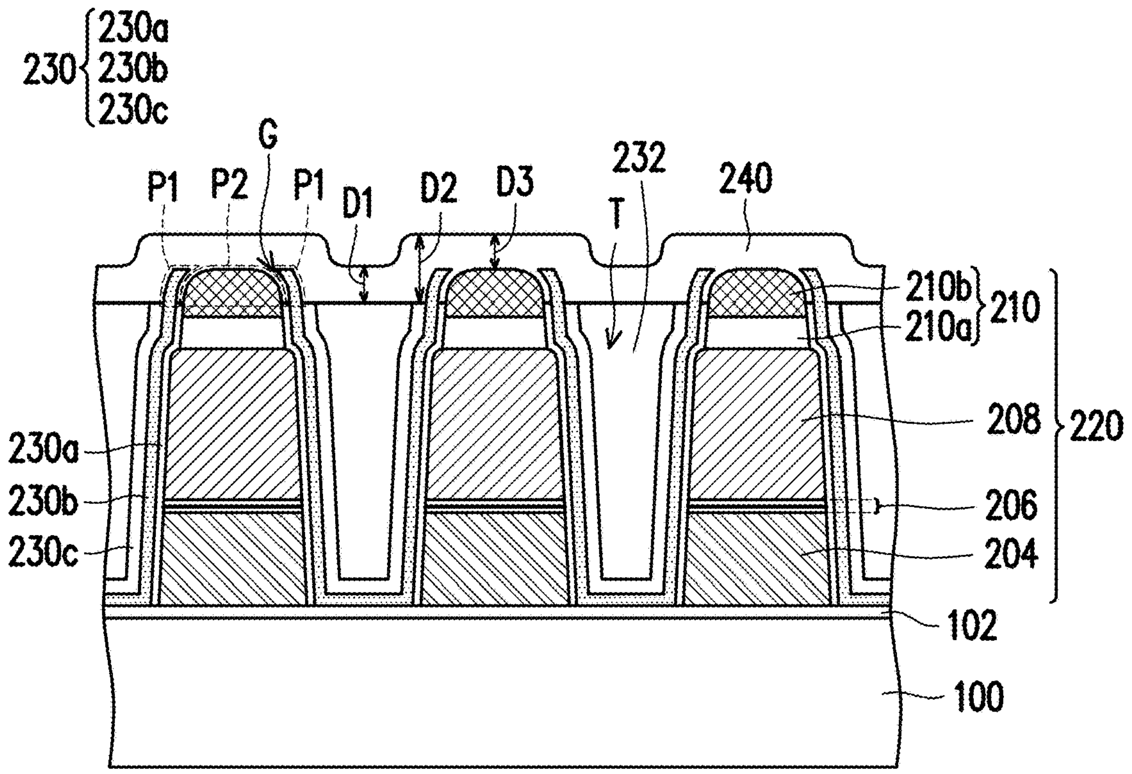
Figure 1I:
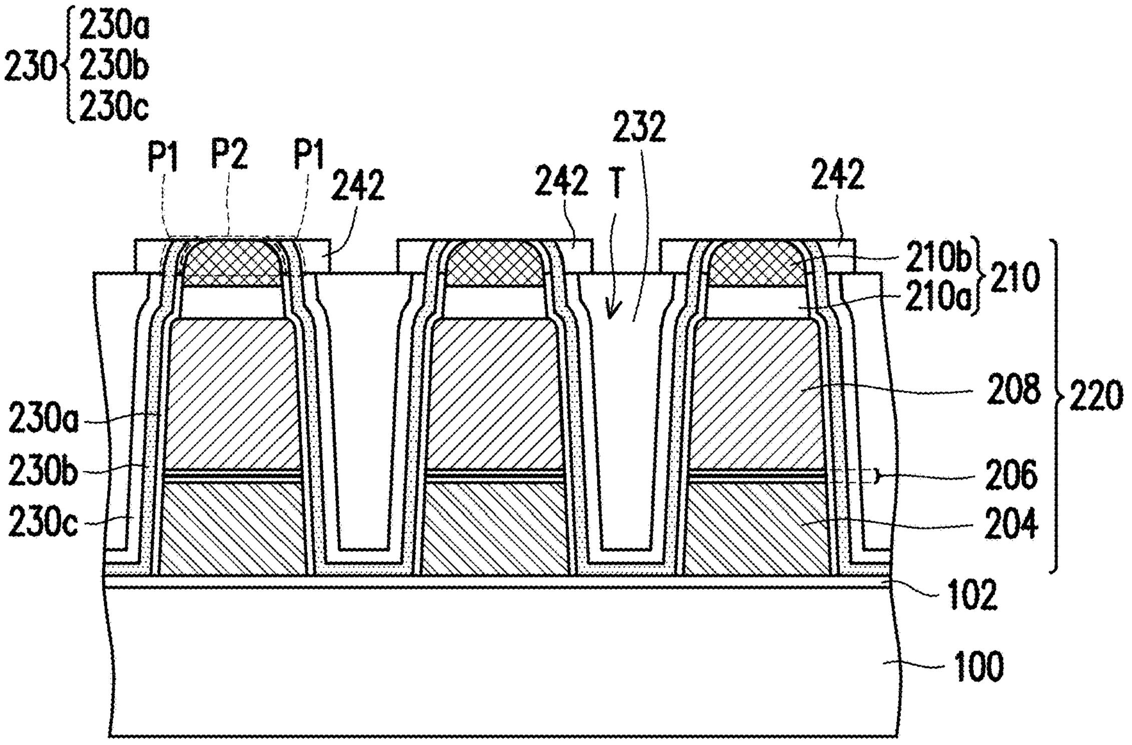
Figure 1J:
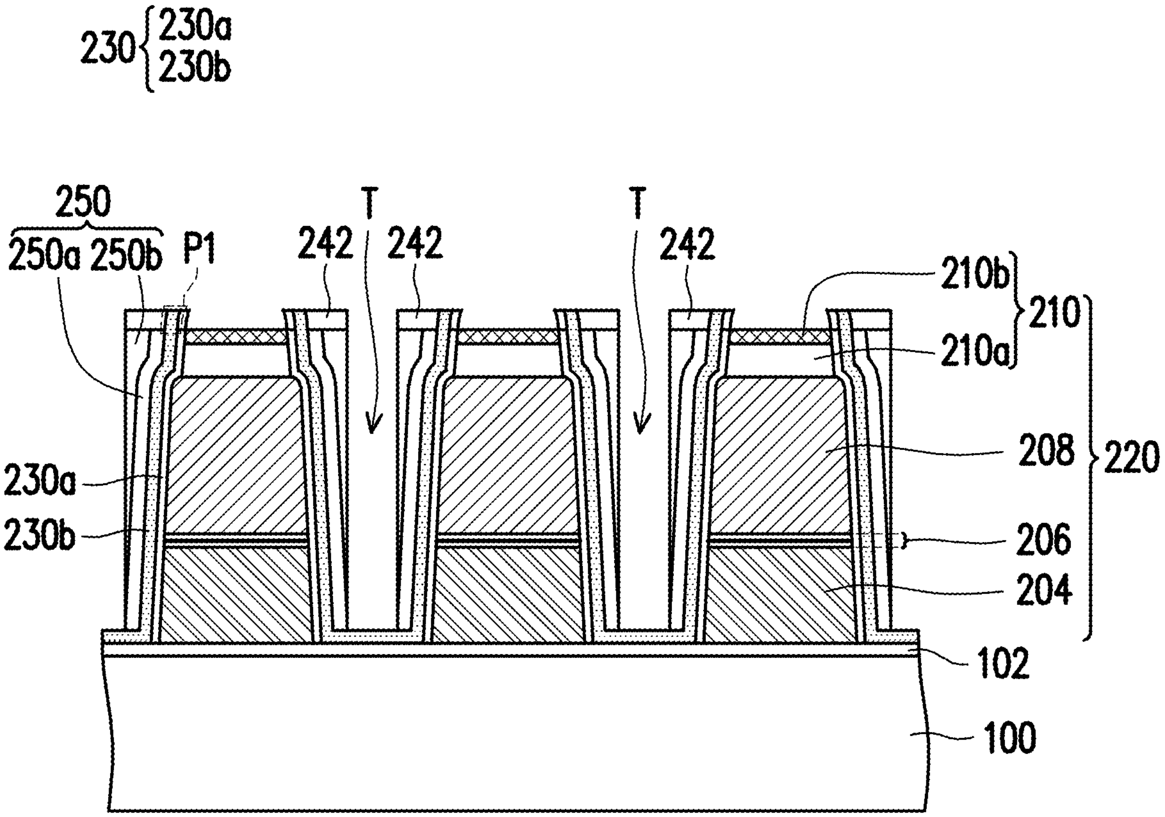
Figure 1K:
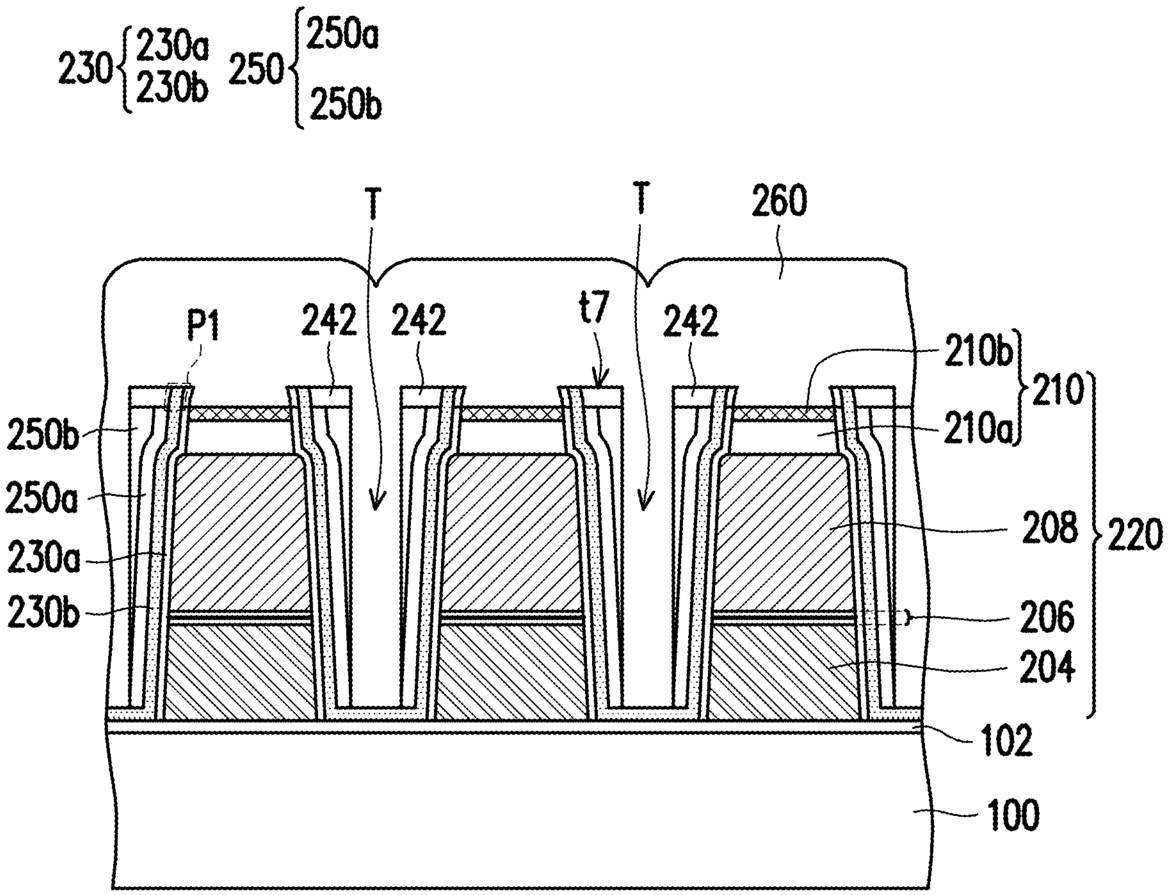
Figure 1L:
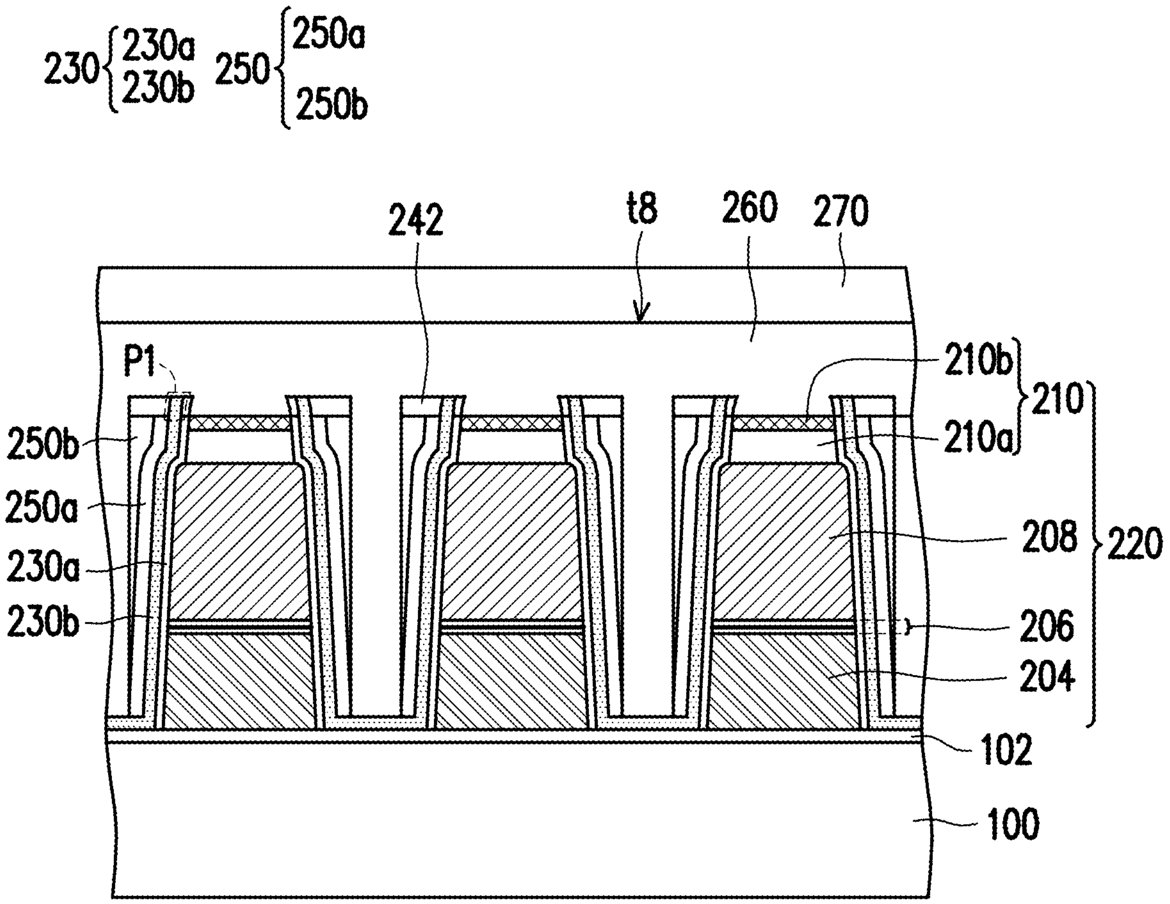
Figure 1M:
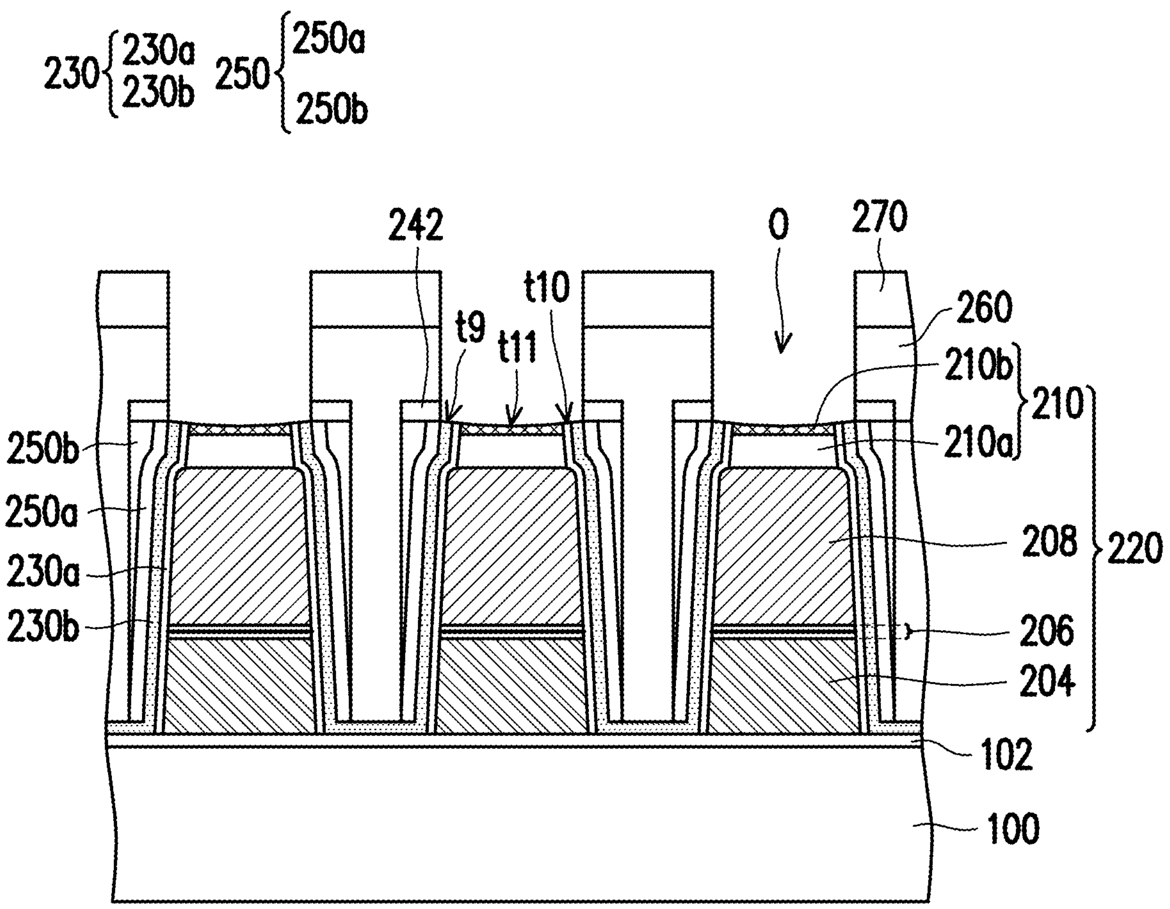
Figure 1N:
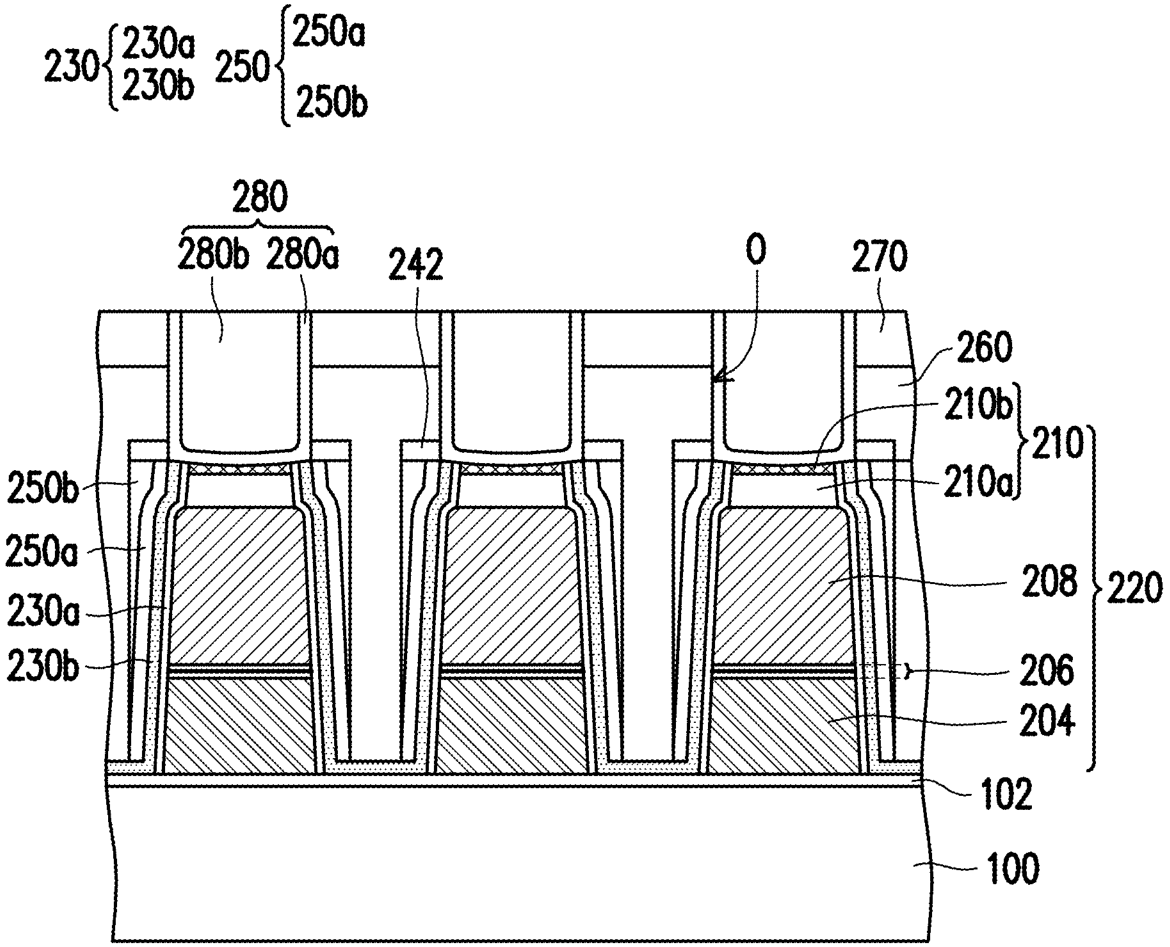
Figure 1P:
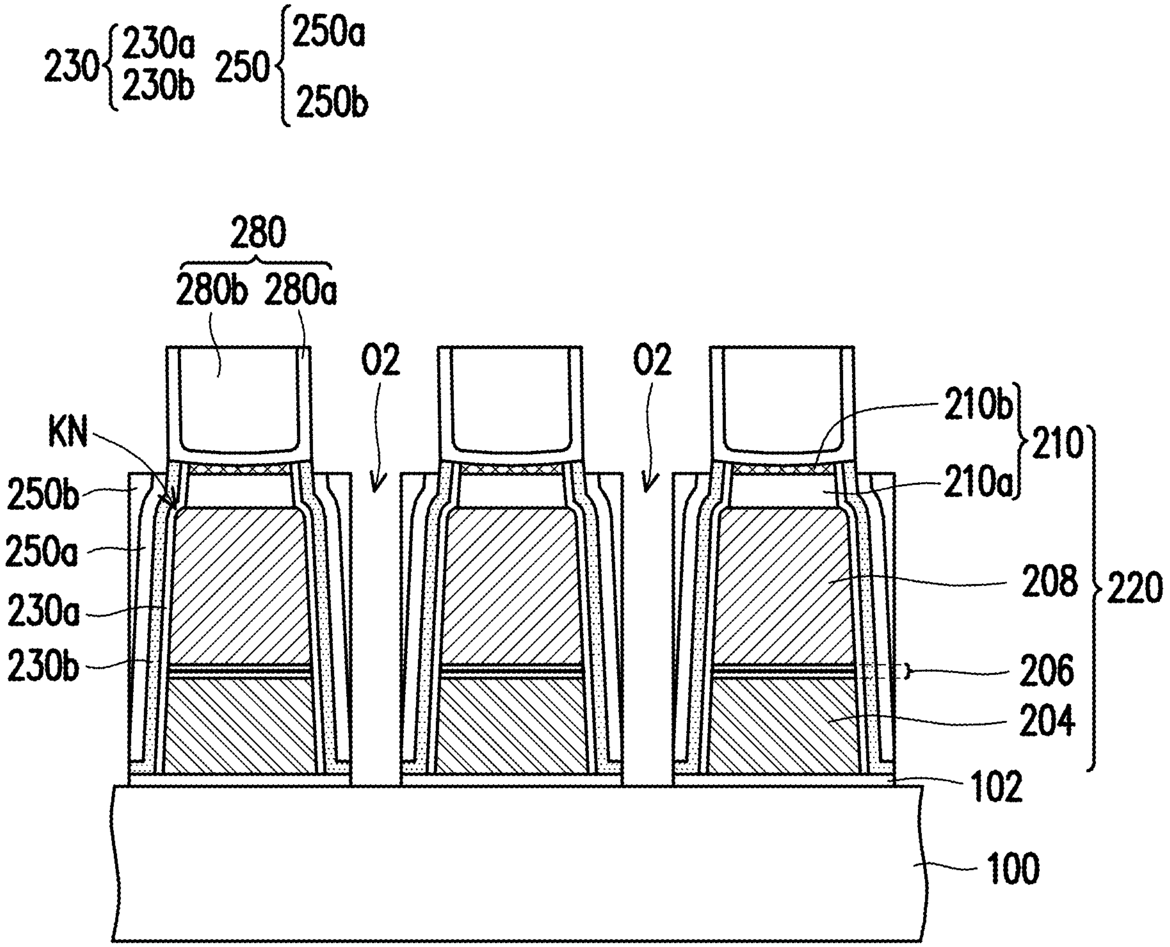
Figure 1Q:
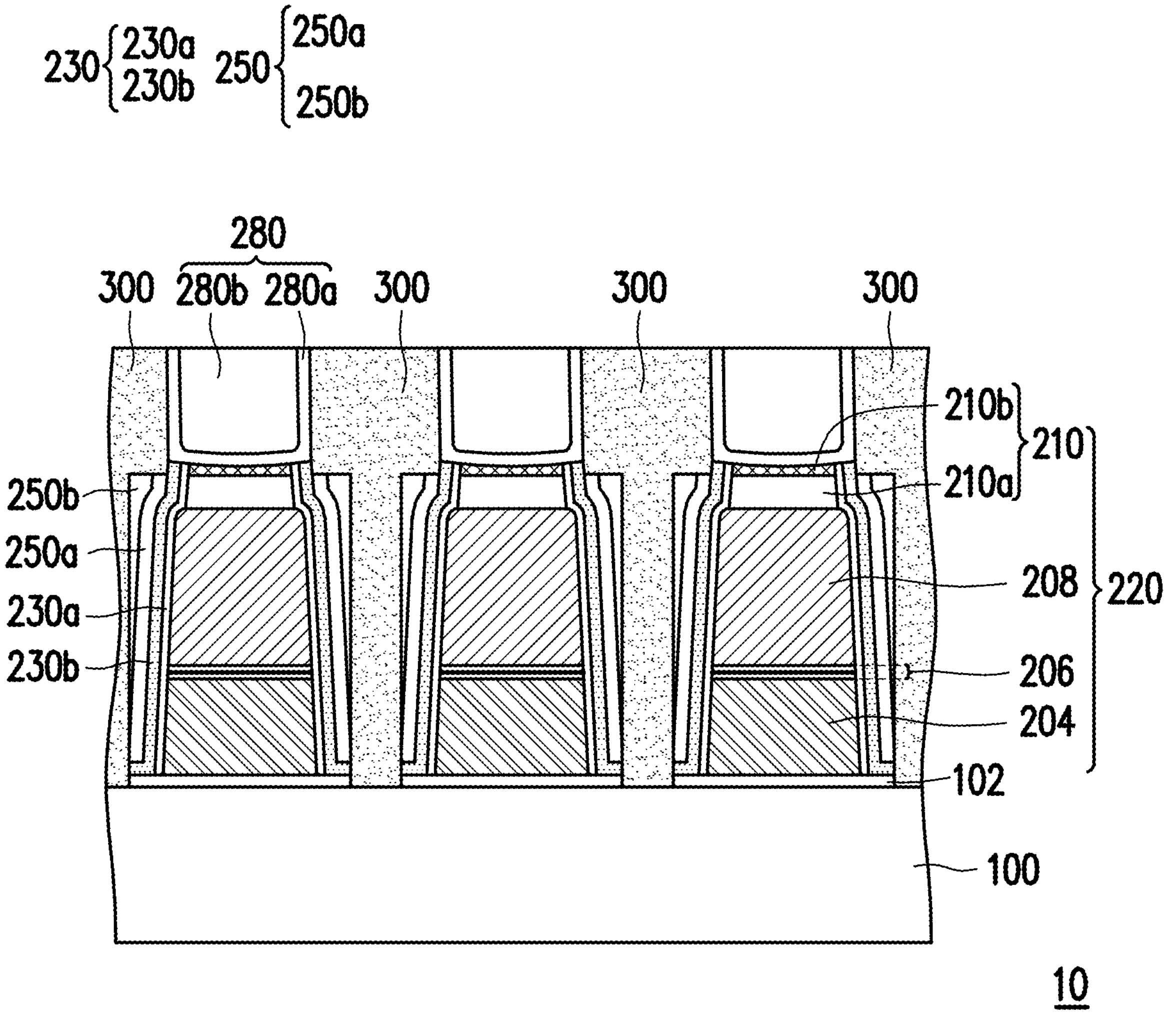

FIG. 1A to FIG. 1Q are schematic cross-sectional structural views of a semiconductor structure at various stages in the formation method according to an embodiment of the present disclosure.

Referring to FIG. 1A, a substrate 100 is first provided. In one embodiment, the substrate 100 may be, for example, a semiconductor substrate, a semiconductor compound substrate, or a semiconductor-on-insulator (SOI) substrate. In one embodiment, the substrate 100 is a silicon substrate.

Then, a tunnel dielectric layer 102 is formed on the substrate 100. In one embodiment, the material of the tunnel dielectric layer 102 may include silicon oxide, and the formation method thereof may be a chemical vapor deposition method, a thermal oxidation method, or the like.

Afterwards, a stack layer 120 is formed on the tunnel dielectric layer 102. As shown in FIG. 1A, the stack layer 120 includes in order from bottom to top: a conductor layer 104, an inter-gate dielectric layer 106, a conductor layer 108 and a cap structure 110. In one embodiment, the material of the conductor layer 104 may include a conductor material, such as doped polycrystalline silicon, non-doped polycrystalline silicon, or a combination thereof, and the formation method thereof may be a chemical vapor deposition method. In one embodiment, the material of the inter-gate dielectric layer 106 may include a composite layer composed of oxide layer/nitride layer/oxide layer (oxide/nitride/oxide, ONO), such as a composite layer composed of silicon oxide/silicon nitride/silicon oxide. In one embodiment, the inter-gate dielectric layer 106 may be formed by a chemical vapor deposition method, for example. In one embodiment, the material of the conductor layer 108 may include a conductor material, such as doped polycrystalline silicon, non-doped polycrystalline silicon, or a combination thereof, and the formation method thereof may be a chemical vapor deposition method.

As shown in FIG. 1A, the cap structure 110 includes a cap layer 110*a* and a cap layer 110*b* disposed on the cap layer 110*a*. In one embodiment, the material of the cap layer 110*a* may be, for example, tetraethoxysilane (TEOS), and the formation method thereof may be chemical vapor deposition method; the material of the cap layer 110*b* may be, for example, silicon nitride, and the formation method thereof may be a chemical vapor deposition method.

Referring to FIG. 1B, a hard mask structure 112 is formed on the stack layer 120. As shown in FIG. 1B, the hard mask structure 112 includes a carbide layer 112*a* and an antireflection layer 112*b* located on the carbide layer 112*a*. In one embodiment, the material of the carbide layer 112*a* may be, for example, spin-on-carbon (SoC); and the material of the antireflection layer 112*b* may be, for example, silicon oxynitrid, and the formation method thereof may be chemical vapor deposition method. Next, a photoresist pattern 114 is formed on the cap structure 110.

Referring to FIG. 1C, the photoresist pattern 114 is used as a mask to perform an etching process on the hard mask structure 112. After the hard mask structure 112 is patterned into a hard mask pattern, the hard mask pattern is used as a mask to perform an etching process on the stack layer 120, and to pattern the stack layer 120 into a plurality of stacked structures 220. In one embodiment, the etching process may be a dry etching process, such as a reactive ion etching process.

Specifically, as shown in FIG. 1C, each stacked structure 220 includes in order from bottom to top: a conductor layer 204, an inter-gate dielectric layer 206, a conductor layer 208 and a cap structure 210. As shown in FIG. 1C, the cap structure 210 includes a cap layer 210*a* and a cap layer 210*b* disposed on the cap layer 210*a*. The materials of the conductor layer 204, the inter-gate dielectric layer 206, the conductor layer 208, the cap layer 210*a* and the cap layer 210*b* are the similar with those of the conductor layer 104, the inter-gate dielectric layer 106, the conductor layer 108, the cap layer 110*a* and the cap layer 110*b*, and thus, their description will not be repeated here. In one embodiment, the conductor layer 204 is used as a floating gate; the conductor layer 208 is used as a control gate; and the entire stacked structure 220 is regarded as a gate structure and used as a word line.

Referring to FIG. 1D, a spacer material layer 230 is formed on the substrate 100. As shown in FIG. 1D, the spacer material layer 230 covers the plurality of stacked structures 220 and the bottoms of the trenches T between the plurality of stacked structures 220. The spacer material layer 230 may include a single-layer structure, a double-layer structure, or a multi-layer structure. For example, the spacer material layer 230 may include a multi-layer structure of an oxide layer 230*a*, a nitride layer 230*b* and an oxide layer 230*c*, as shown in FIG. 1D. In one embodiment, the materials of the oxide layer 230*a* and the oxide layer 230*c* are, for example, silicon oxide; and the material of the nitride layer 230*b* is, for example, silicon nitride. In one embodiment, the spacer material layer 230 may be formed by atomic layer deposition method.

As shown in FIG. 1D, the oxide layer 230*a* is conformally formed on the plurality of stacked structures 220. That is to say, the oxide layer 230*a* is in directly contact with the conductor layer 204, the inter-gate dielectric layer 206, the conductor layer 208 and the cap structure 210. As shown in FIG. 1D, the nitride layer 230*b* is conformally formed on the oxide layer 230*a* and the bottoms of the plurality of trenches T. That is to say, the nitride layer 230*b* is in directly contact with the oxide layer 230*a* and the tunnel dielectric layer 102. As shown in FIG. 1D, the oxide layer 230*c* is conformally formed on the nitride layer 230*b* and is in directly contact with the nitride layer 230*b*.

Referring to FIG. 1E, a spacer material layer 232 is formed on the spacer material layer 230. In detail, the spacer material layer 232 covers the plurality of stacked structures 220 and is filled in the plurality of trenches T. That is, in this step, the spacer material layer 232 is formed higher than the top surface t1 of the oxide layer 230*c*. From another point of view, the spacer material layer 232 is in directly contact with the oxide layer 230*c*. In one embodiment, the material of the spacer material layer 232 may be, for example, tetraethoxysilane, and the formation method thereof may be a low-pressure chemical vapor deposition method.

Referring to FIG. 1F, a planarization process (such as a chemical mechanical polishing process) is performed to remove a portion of the spacer material layer 232, a portion of the oxide layer 230*a*, a portion of the nitride layer 230*b*, and a portion of the oxide layer 230*c*, and expose a top surface t6 of each of the cap layers 210*b*. In this case, the top surface t2 of the spacer material layer 232, the top surface t3 of the oxide layer 230*a*, the top surface t4 of the nitride layer 230*b*, the top surface t5 of the oxide layer 230*c*, and the top surface t6 of the cap layer 210*b* are regarded as being substantially coplanar with each other. In one embodiment, the cap layer 210*b* is not removed during this planarization process. In another embodiment, during this planarization process, the cap layer 210*b* is slightly removed.

Referring to FIG. 1G, a portion of the spacer material layer 232, a portion of the oxide layer 230*a*, and a portion of the oxide layer 230*c* are etched back to expose the portion P1 of the nitride layer 230*b* and the portion P2 of each cap layer 210*b*. In this case, the portion P1 of the nitride layer 230*b* and the portion P2 of each cap layer 210*b* protrude from the spacer material layer 232, the oxide layer 230*a*, and the oxide layer 230*c*. Specifically, after etching the spacer material layer 232, the oxide layer 230*a* and the oxide layer 230*c*, the top surface t4 of the nitride layer 230*b* and the top surface t6 of each cap layer 210*b* are higher than the top surface t2 of the spacer material layer 232, the top surface t3 of the oxide layer 230*a* and the top surface t5 of the oxide layer 230*c*. From another point of view, after etching the spacer material layer 232, the oxide layer 230*a* and the oxide layer 230*c*, a plurality of gaps G are formed between the portion P1 of the nitride layer 230*b* and the portion P2 of each cap layer 210*b*.

In one embodiment, etching the spacer material layer 232, the oxide layer 230*a* and the oxide layer 230*c* includes performing a wet etching process. The wet etching process uses an etching liquid with a high etching selectivity ratio, which does not remove or only slightly removes the nitride layer 230*b* and the cap layer 210*b* while removing the portion of the spacer material layer 232, the portion of the oxide layer 230*a*, and the portion of the oxide layer 230*c*. That is to say, the etching liquid used in the wet etching process has a high etching selectivity ratio on oxides with respect to nitrides.

Referring to FIG. 1H, a hard mask layer 240 is formed on the substrate 100. Specifically, as shown in FIG. 1H, the hard mask layer 240 is conformally formed on the spacer material layer 232, the oxide layer 230*c*, the portion P1 of the nitride layer 230*b* and the portion P2 of each cap layer 210*b*, and filled in the plurality of gaps G. As shown in FIG. 1H, the thickness D2 of the portion of the hard mask layer 240 surrounding the portion P1 of the nitride layer 230*b* is greater than the thickness D3 of the portion of the hard mask layer 240 located directly above the portion P2 of the cap layer 210*b* (or the portion P1 of the nitride layer 230*b*), and greater than the thickness D1 of the portion of the hard mask layer 240 located directly above the spacer material layer 232. In one embodiment, the material of the hard mask layer 240 may include polycrystalline silicon, and the formation method thereof may be a low-pressure chemical vapor deposition method.

Referring to FIG. 1I, an etching process is performed on the hard mask layer 240 to form a plurality of hard mask patterns 242 separated from each other. As shown in FIG. 1I, each hard mask pattern 242 surrounds the portion PI of the nitride layer 230*b,* is located in the corresponding gap G, and exposes a portion of the spacer material layer 232 between two adjacent stacked structures 220. Since the thickness D2 is greater than the thickness D1 and the thickness D3 (as shown in FIG. 1H), the plurality of hard mask patterns 242 separated from each other can be formed by self-alignment during the etching process of the hard mask layer 240, and thus the process complexity and manufacturing costs can be reduced. In one embodiment, the etching process may be a dry etching process.

Referring to FIG. 1J, the plurality of hard mask patterns 242 are used as a mask to perform an etching process on the spacer material layer 232 and the oxide layer 230*c,* so as to remove the portions of the spacer material layer 232 and the oxide layer 230*c* exposed by the plurality of hard mask patterns 242. Thereby, a spacer structure 250 is formed on the sidewall of each stacked structure 220. As shown in FIG. 1J, the spacer structure 250 includes a spacer 250*a* derived from the oxide layer 230*c* and a spacer 250*b* derived from the spacer material layer 232.

In one embodiment, the etching process may be a dry etching process. Specifically, in the dry etching process, the spacer material layer 232 has a high etching selectivity ratio with respect to the plurality of hard mask patterns 242 and the cap layer 210*b,* and the oxide layer 230*c* has a high etching selectivity atio with respect to the plurality of hard mask patterns 242 and the cap layer 210*b.* That is to say, during the dry etching process, the portion of the spacer material layer 232 and the portion of the oxide layer 230*c* exposed by the plurality of hard mask patterns 242 are completely removed, while only a small amount of the plurality of hard mask patterns 242 and the cap layer 210*b* is removed, as shown in FIG. 1J. In other words, the etchant used in the dry etching process has a high etching selectivity ratio of oxide to nitride and oxide to polycrystalline silicon.

Since the spacer structure 250 is formed by performing an etching process using the plurality of hard mask patterns 242 as a mask, the spacer structure 250 has an approximately vertical cross-sectional profile, as shown in FIG. 1J. In addition, since the portion of the spacer material layer 232 and the portion of the oxide layer 230*c* are removed using the plurality of hard mask patterns 242 as a mask, the spacer structure 250 can be formed in a self-aligned manner, thereby reducing process complexity and manufacturing cost.

Referring to FIG. 1K, a sacrificial layer 260 is formed on the plurality of hard mask patterns 242 and between the plurality of spacer structures 250. In detail, as shown in FIG. 1K, the sacrificial layer 260 covers the plurality of stacked structures 220 and the plurality of hard mask patterns 242, and is filled in the plurality of trenches T, so as to contact the outer sidewalls of the plurality of spacer structures 250 and the nitride layer 230*b* exposed by the plurality of spacer structures 250. That is to say, in this step, the sacrificial layer 260 is formed as higher than the top surface t7 of the plurality of hard mask patterns 242. In one embodiment, the material of the sacrificial layer 260 may include, for example, polycrystalline silicon, and the formation method may be a low-pressure chemical vapor deposition method.

Referring to FIG. 1L, a planarization process (such as a chemical mechanical polishing process) is performed on the sacrificial layer 260 so that the sacrificial layer 260 has a flat top surface t8. Next, continued on FIG. 1L, a hard mask layer 270 is formed on the top surface t8 of the sacrificial layer 260. In one embodiment, the material of the hard mask layer 270 may be, for example, silicon nitride, and the formation method thereof may be a chemical vapor deposition method.

Referring to FIG. 1M, the hard mask layer 270 is patterned to remove the hard mask layer 270 located above the plurality of stacked structures 220. Then, the patterned hard mask layer 270 is used as a mask to remove the sacrificial layer 260 that is not covered by the hard mask layer 270, so as to form a plurality of openings O penetrating through the sacrificial layer 260 above the plurality of stacked structures 220. That is to say, the patterned hard mask layer 270 is used to define the positions of the plurality of openings Os subsequently formed above the plurality of stacked structures 220. In addition, as shown in FIG. 1M, during the formation of the plurality of openings O, a portion of each hard mask pattern 242 and the portion P1 of the nitride layer 230*b* are also removed. In other words, each opening O is sized to remove at least the portion P1 of the nitride layer 230*b.* In addition, as shown in FIG. 1M, each opening O can expose the top surface t9 of the nitride layer 230*b,* the top surface t10 of the oxide layer 230*a,* and the top surface t11 of the cap layer 210*b.* In one embodiment, the cap layer 210*b* is not removed during the formation of the plurality of openings O. In another embodiment, the cap layer 210*b* is slightly removed during the formation of the plurality of openings O. In one embodiment, the portion of the sacrificial layer 260 may be removed through a dry etching process, such as a reactive ion etching process, to form the plurality of openings O.

Referring to FIG. IN, a plurality of dielectric plugs 280 are formed in a plurality of openings O. The dielectric plugs 280 are used to define the positions of the contact plugs that will be formed later, and can protect the plurality of stacked structures 220 to prevent mobile ions from affecting reliability. Specifically, as shown in FIG. IN, each dielectric plug 280 includes a spacing layer 280*a* and a dielectric material layer 280*b* surrounded by the spacing layer 280*a.* In one embodiment, the method of forming the plurality of dielectric plugs 280 includes the following steps. First, the spacing layer 280*a* is formed to conformally cover the patterned hard mask layer 270 and the surfaces of the plurality of openings O. That is to say, the spacing layer 280*a* is conformally formed in the plurality of openings O. In one embodiment, the material of the spacing layer 280*a* may include a dielectric material, such as silicon nitride, and the formation method thereof may be a chemical vapor deposition method. Next, a dielectric material is formed on the substrate 100 to fill the plurality of openings O and cover the spacing layer 280*a.* In one embodiment, the dielectric material may be, for example, tetraethoxysilane, and the formation method thereof may be a low-pressure chemical vapor deposition method. After that, a planarization process (such as a chemical mechanical polishing process) is performed to remove the dielectric material and spacing layer 280*a* outside the plurality of openings O to expose the top surface of the patterned hard mask layer 270, and form the plurality of dielectric material layers 280*b* in the plurality of openings O and each surrounded by the corresponding spacing layer 280*a*.

Figure 10:
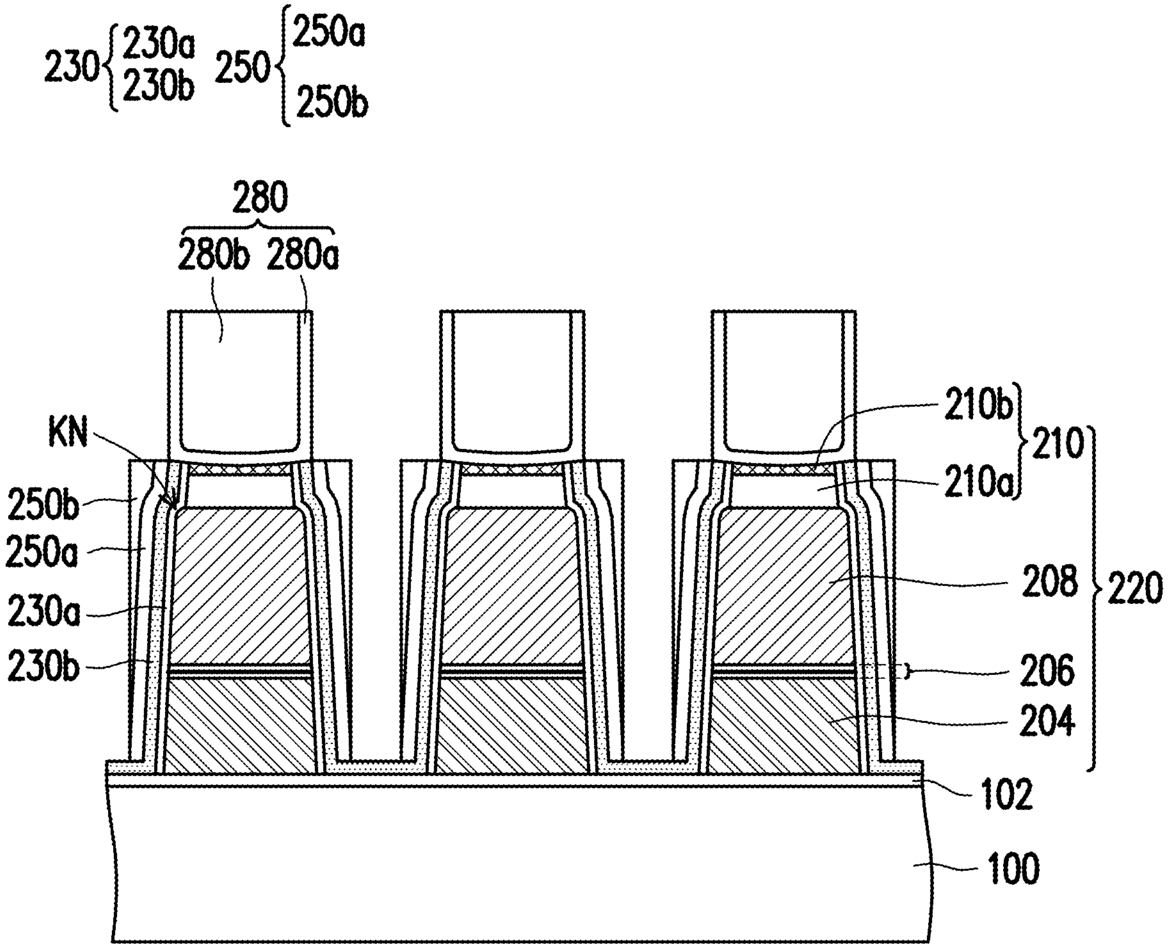

Referring to FIG. 10, after forming the plurality of dielectric plugs 280, the patterned hard mask layer 270 is removed. In one embodiment, the method of removing the patterned hard mask layer 270 may include performing a dry etching process, such as a reactive ion etching process. Next, continued on FIG. 10, the sacrificial layer 260 is removed. In one embodiment, the method of removing the sacrificial layer 260 may include performing a wet etching process.

Referring to FIG. 1P, portions of the nitride layer 230*b* and the tunnel dielectric layer 102 are removed to form a plurality of contact openings O2 between the plurality of stacked structures 220 and a spacer structure 290 on the sidewall of each stacked structure 220. Each contact opening O2 exposes a portion of the top surface of the substrate 100. As shown in FIG. 1P, the spacer structure 290 includes the spacer structure 250, a spacer 290*a* derived from the nitride layer 230*b*, and the oxide layer 230*a*. As mentioned above, the spacer structure 250 has an approximately vertical cross-sectional profile, so the spacer structure 290 also has an approximately vertical cross-sectional profile.

In one embodiment, the method for removing the nitride layer 230*b* and the tunnel dielectric layer 102 may include performing a dry etching process, such as a reactive ion etching process. In one embodiment, as shown in FIG. 10 and FIG. 1P, during the removal of the nitride layer 230*b* and the tunnel dielectric layer 102, each dielectric plug 280 and each spacer structure 250 are also slightly removed and moved downward (i.e., the heights thereof are reduced).

It is worth noting that since the spacer structure 290 is formed with an approximately vertical cross-sectional profile, the etching process of forming the plurality of contact openings O2 is avoided from causing excessive losses to the thickness of the spacer structure 290, thereby reducing risks of exposing the shoulder KN of the stacked structure 220, improving the problems such as word line leakage, bit line leakage or short circuit, increasing process margin, and improving the reliability and performance of components.

Referring to FIG. 1Q, the plurality of contact openings O2 are filled with conductive material to form a plurality of contact plugs 300. In one embodiment, the contact plug 300 may be a self-aligned contact. In one embodiment, the conductive material may be completely filled in the plurality of contact openings O2 and formed between the plurality of dielectric plugs 280.

In one embodiment, the conductive material forming the contact plug 300 may include metal, polycrystalline silicon, other suitable materials, or a combination of the foregoing, and the formation method may be an electroplating method, a physical vapor deposition method, a chemical vapor deposition method, or other suitable formation methods. In one embodiment, the metal may include tungsten (W), copper (Cu), aluminum (Al), gold (Au), silver (Ag), titanium (Ti), molybdenum (Mo), nickel (Ni), tungsten alloy, copper alloy, aluminum alloy, gold alloy, silver alloy, titanium alloy, molybdenum alloy, nickel alloy, other suitable metal materials, or combinations of the above.

At this point, the production of the semiconductor structure 10 is roughly completed. Specifically, as shown in FIG. 1Q, the semiconductor structure 10 may include the substrate 100, the plurality of stacked structures 220, the plurality of spacer structures 290, and the plurality of contact plugs 300. The plurality of stacked structures 220 are located on the substrate 100, each spacer structure 290 is located on the sidewall of the corresponding stacked structure 220, and each contact plug 316 may be located between the corresponding two adjacent stacked structures 220, each spacer structure 290 has an approximately vertical cross-sectional profile. In one embodiment, the plurality of dielectric plugs 280 may be located above the plurality of stacked structures 220.

To sum up, in the forming method of the semiconductor structure provided by the embodiment of the present disclosure, each stacked structure includes a cap structure with two layers of cap layers stacked on each other with different materials, so that in subsequent process steps, a portion of the upper cap layer in each stacked structure can protrude from the adjacent spacer material layer to be used for forming the self-aligned hard mask patterns. In this way, by using the hard mask patterns as a mask to remove a portion of the spacer material layer, a spacer structure with an approximately vertical profile can be formed on the sidewall of each stacked structure, the loss of the thickness of the spacer structure caused by the etching removal step can be reduced, the shoulders of the gate structure can be avoided to be exposed, and thereby the problems such as word line leakage, bit line leakage or short circuit can be improved, and the reliability and performance of components can be improved.

What is claimed is:

1. A method for forming a semiconductor structure, comprising:

providing a substrate;

forming a plurality of stacked structures on the substrate, wherein each of the plurality of stacked structures includes a cap structure, the cap structure comprises a first cap layer and a second cap layer located on the first cap layer, and materials of the first cap layer and the second cap layer are different;

forming a first spacer material layer on the substrate and the plurality of stacked structures;

forming a second spacer material layer on the first spacer material layer;

performing a planarization process to remove a first portion of the second spacer material layer and a first portion of the first spacer material layer to expose the second cap layer in each of the plurality of stacked structures;

removing a second portion of the second spacer material layer so that a first portion of the exposed second cap layer in each of the plurality of stacked structures protrudes from the second spacer material layer;

forming a plurality of hard mask patterns being self-aligned with the first portion of the exposed second cap layer in each of the plurality of stacked structures;

using the plurality of hard mask patterns as a mask, removing a third portion of the second spacer material layer to form a first spacer structure on a sidewall of each of the plurality of stacked structures;

forming a sacrificial layer on the plurality of hard mask patterns and between the plurality of stacked structures;

removing the sacrificial layer and a second portion of the first spacer material layer to form a plurality of contact openings between the plurality of stacked structures, and the plurality of contact openings expose the substrate; and filling the plurality of contact openings with a conductive material to form a plurality of contact plugs.

2. The method according to claim 1, wherein a dry etching process is used to remove the third portion of the second spacer material layer, and in the dry etching process, the second spacer material layer has a high etching selectivity ratio with respect to the plurality of hard mask patterns and the exposed second cap layer in each of the plurality of stacked structures.

3. The method according to claim 2, wherein a material of the second spacer material layer includes tetraethoxysilane, a material of the plurality of hard mask patterns includes polycrystalline silicon, and a material of the exposed second cap layer in each of the plurality of stacked structures includes silicon nitride.

4. The method according to claim 1, wherein the first spacer material layer includes a first oxide layer, a nitride layer and a second oxide layer.

5. The method according to claim 4, wherein the removed first portion of the first spacer material layer includes the first oxide layer, the nitride layer and the second oxide layer.

6. The method according to claim 4, wherein while removing the second portion of the second spacer material layer, a portion of the first oxide layer and a portion of the second oxide layer are removed, so that a first portion of the nitride layer protrudes from the second spacer material layer.

7. The method according to claim 6, wherein the plurality of hard mask patterns are self-aligned to the first portion of the nitride layer.

8. The method according to claim 6, wherein after forming the sacrificial layer on the plurality of hard mask patterns and between the plurality of stacked structures, further comprises:

removing a portion of the sacrificial layer to form a plurality of openings on the plurality of stacked structures, wherein the plurality of openings penetrate through the sacrificial layer on the plurality of stacked structures; and forming a plurality of dielectric plugs in the plurality of openings.

9. The method according to claim 8, further comprising removing the first portion of the nitride layer during forming the plurality of openings.

10. The method of according to claim 4, wherein the removed second portion of the first spacer material layer includes the nitride layer.

* * * * *